(12) United States Patent
Shalita et al.

(10) Patent No.: US 11,171,655 B2
(45) Date of Patent: Nov. 9, 2021

(54) MULTI-CHIP SYNCHRONIZATION WITH APPLICATIONS IN MULTIPLE-INPUT MULTIPLE-OUTPUT (MIMO) RADAR SYSTEMS

(71) Applicant: Intel Corporation, Santa Clara, CA (US)

(72) Inventors: Oren Shalita, Tel-Aviv (IL); Roy Sofer, Binyamina (IL); Alon Cohen, Petach Tikva (IL); Sharon Heruti, Tel-Aviv (IL); Natarajan Karthik, Portland, OR (US); Kailash Chandrashekar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 221 days.

(21) Appl. No.: 16/455,247

(22) Filed: Jun. 27, 2019

(65) Prior Publication Data

US 2019/0386665 A1 Dec. 19, 2019

(51) Int. Cl.
| | | |
|---|---|---|
| *H03L 7/085* | (2006.01) | |
| *G04F 10/00* | (2006.01) | |
| *G01S 7/03* | (2006.01) | |
| *H03L 7/081* | (2006.01) | |

(52) U.S. Cl.
CPC ............ *H03L 7/085* (2013.01); *G01S 7/03* (2013.01); *G04F 10/005* (2013.01); *H03L 7/081* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,209,958 | B1 * | 12/2015 | Palaskas | H04L 7/0087 |
| 2013/0094611 | A1 * | 4/2013 | Lai | H03F 3/2178 |
| | | | | 375/297 |
| 2014/0368242 | A1 * | 12/2014 | Unruh | H03L 1/00 |
| | | | | 327/156 |
| 2015/0358149 | A1 * | 12/2015 | Ito | H04L 27/0014 |
| | | | | 375/360 |
| 2016/0173303 | A1 * | 6/2016 | Sai | H04L 27/16 |
| | | | | 375/323 |
| 2016/0248524 | A1 * | 8/2016 | Laaja | H04B 17/12 |

(Continued)

*Primary Examiner* — Adam D Houston
(74) *Attorney, Agent, or Firm* — Schwabe, Williamson & Wyatt, P.C.

(57) ABSTRACT

An EC platform including a controller to control multiple integrated circuits (ICs) to synchronize an operational internal clock signal of an IC with a master clock signal. The controller generates commands for the IC to measure a phase difference or latency difference between an initial internal clock signal of the IC and an input clock signal to the IC from a parent IC. The controller further receives a difference signal from the IC to indicate the phase or latency difference. The IC includes a measurement circuit to measure the phase or latency difference, and to generate a difference signal to indicate the phase or latency difference. The IC further includes a synchronization clock generator to generate, based on the initial internal clock signal and the difference signal, an operational internal clock signal synchronized with the master clock signal. Other embodiments may also be described and claimed.

25 Claims, 8 Drawing Sheets

(56) References Cited

U.S. PATENT DOCUMENTS

| | | | |
|---|---|---|---|
| 2016/0380758 A1* | 12/2016 | Sai | H03L 7/081 |
| | | | 375/376 |
| 2017/0170837 A1* | 6/2017 | Sai | H03L 7/113 |
| 2017/0365933 A1* | 12/2017 | Topak | H01Q 1/3233 |
| 2018/0062826 A1* | 3/2018 | Okuni | H04L 7/0079 |
| 2018/0175867 A1* | 6/2018 | Lopelli | H03L 7/0991 |
| 2018/0217254 A1* | 8/2018 | Hong | H01Q 9/04 |
| 2019/0334533 A1* | 10/2019 | Nassar | H03L 7/091 |
| 2019/0375358 A1* | 12/2019 | Lee | G01S 13/325 |
| 2019/0386665 A1* | 12/2019 | Shalita | G01S 7/032 |
| 2020/0012301 A1* | 1/2020 | Lee | G05F 1/575 |
| 2020/0136239 A1* | 4/2020 | Jeong | H04B 7/0617 |
| 2020/0162084 A1* | 5/2020 | Darabi | H03B 5/32 |
| 2020/0185818 A1* | 6/2020 | Kim | H01Q 21/06 |
| 2020/0185819 A1* | 6/2020 | Kim | H01Q 1/42 |
| 2020/0295765 A1* | 9/2020 | Agrawal | H03L 7/091 |
| 2020/0389196 A1* | 12/2020 | Choi | H04N 21/23605 |
| 2021/0021272 A1* | 1/2021 | Karandikar | H03L 7/185 |
| 2021/0067163 A1* | 3/2021 | Karandikar | H04B 1/126 |
| 2021/0072369 A1* | 3/2021 | Heller | G01S 7/4026 |

* cited by examiner

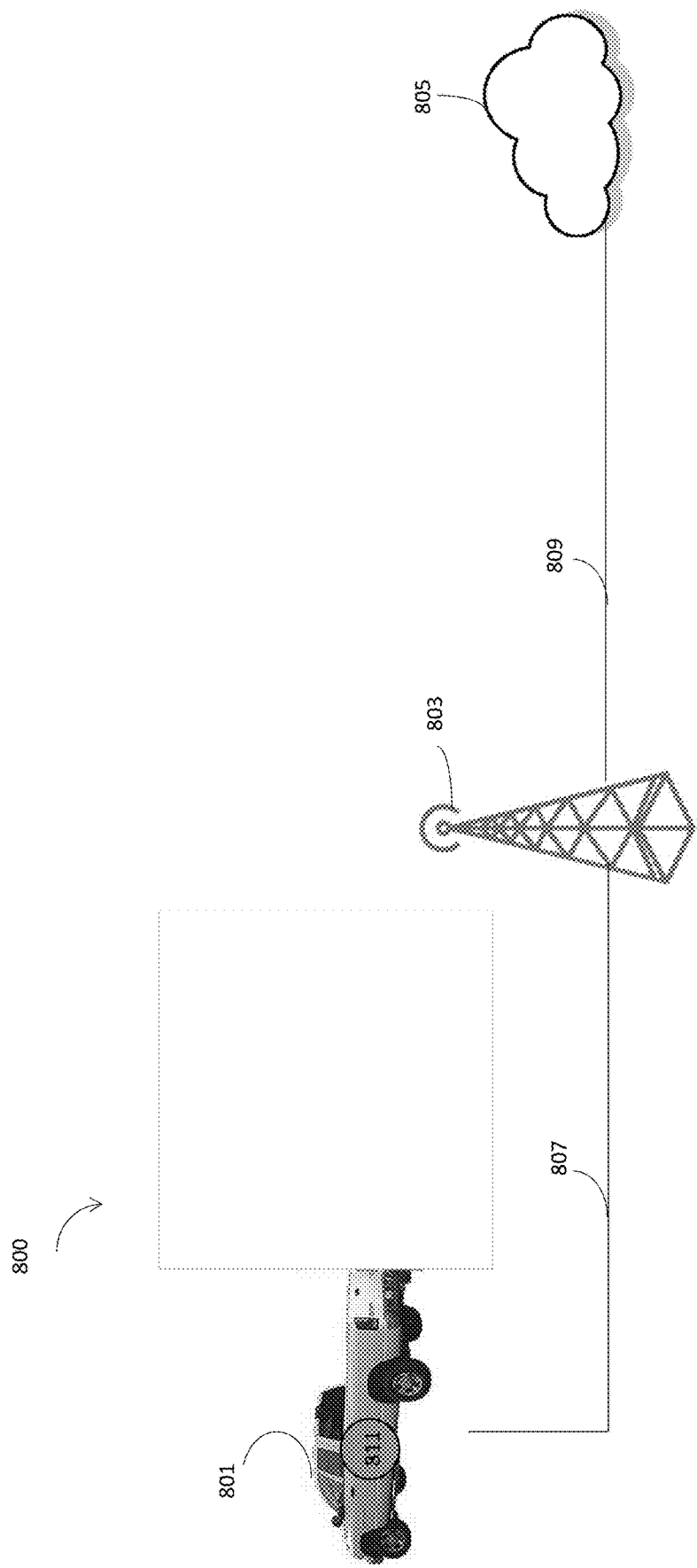

MULTI-CHIP SYNCHRONIZATION WITH APPLICATIONS IN MULTIPLE-INPUT MULTIPLE-OUTPUT (MIMO) RADAR SYSTEMS

FIELD

Embodiments of the present disclosure relate generally to the technical fields of electronics and communications, and more particularly to multi-chip synchronization with applications in multiple-input multiple-output (MIMO) radar systems and computer assisted or autonomous driving (CA/AD) vehicles.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A complex electronic/computing system often includes multiple chips or integrated circuits (ICs) working together for some applications. A clock signal is a particular type of signal normally supplied to an IC to coordinate the operations of the IC. When an electronic/computing system includes multiple ICs, the synchronization of clock signals of multiple ICs may be needed so that each IC may function properly with respect to the timing of the rest ICs of the electronic/computing system. As an example, a multiple-input multiple-output (MIMO) radar system may include multiple ICs to transmit or receive electromagnetic radiation to a region of interest. A MIMO radar system may be used in a computer assisted or autonomous driving (CA/AD) vehicle for various purposes. The synchronization of clock signals of multiple ICs in a MIMO radar system or many other systems plays an important role for the system to function properly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 8 illustrates an environment in which various embodiments described with references to FIGS. 1-7 may be practiced.

DETAILED DESCRIPTION

Figure 1:
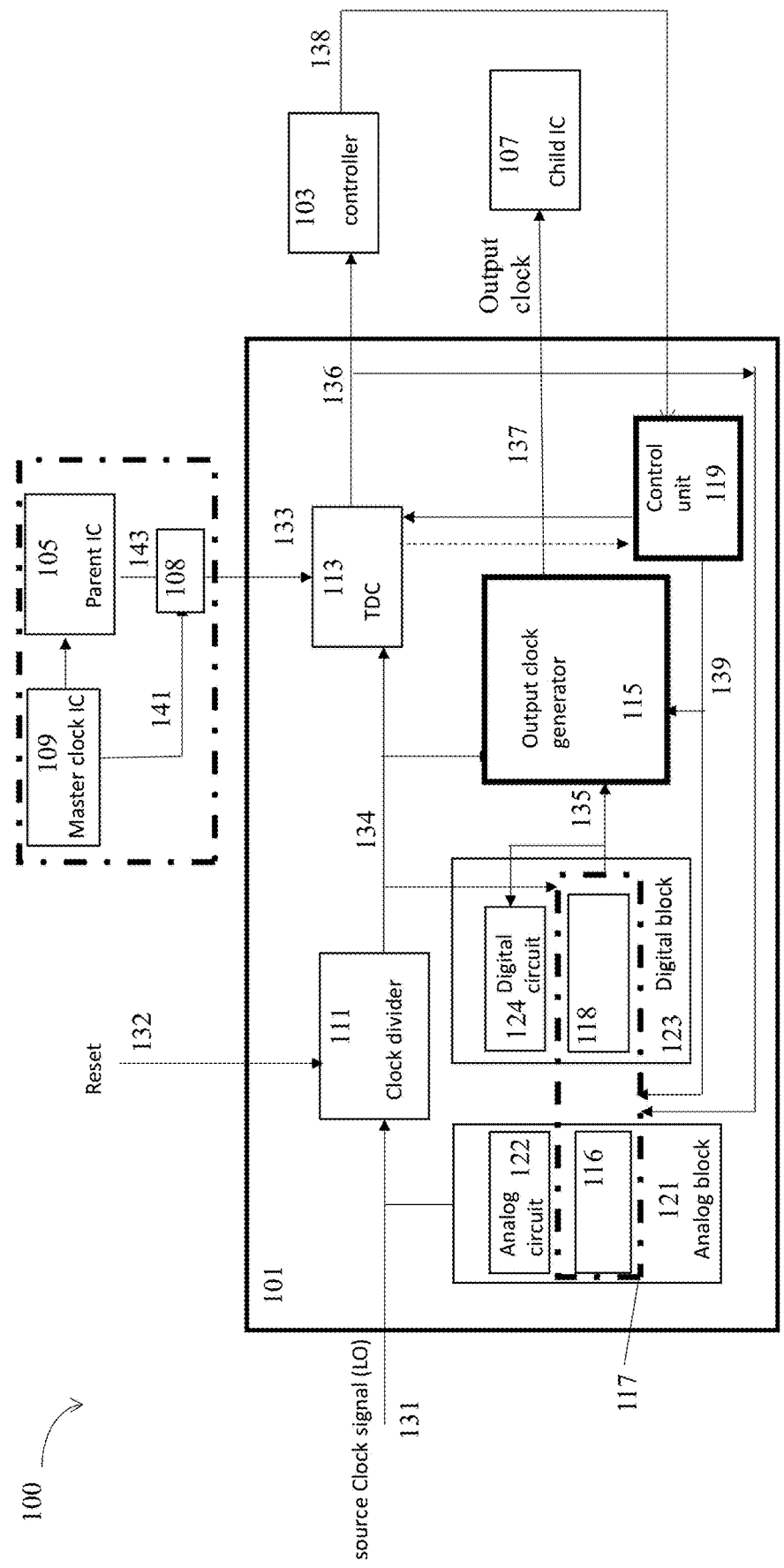
FIG. 1 illustrates an example integrated circuit (IC) incorporated with the clock synchronization technology of the present disclosure, in accordance with various embodiments.

Synchronization of clock signals of multiple ICs in an electronic/computing system may play an important role for maintaining coherency among the multiple ICs, and in turn, the proper functioning of the electronic/computing system.

A multiple-input multiple-output (MIMO) radar system may monitor one or more objects in a region of interest. A MIMO radar system can be used on a computer assisted or autonomous driving (CA/AD) vehicle to perform various functions, e.g., on-vehicle collision hazard warning, automatic braking of the vehicle, or monitoring hazards at busy safety-critical regions, e.g., railway level-crossings and pedestrian crossings. A CA vehicle may be a vehicle equipped with various sensing capability to assist a driver in driving/operating the vehicle. An AD vehicle may also be referred to as a driverless car, a self-driving car, a robotic car, or a unmanned ground vehicle, and it may be a vehicle that is capable of sensing its environment and navigating without human input for certain functions.

A MIMO radar system having a plurality of transmitters (TX) and receivers (RX), may include multiple ICs. It is important to maintain coherency among the multiple ICs of the TX and the RX to perform various functions, e.g., maintaining the orthogonality of the transmitter, de-ciphering the receiver data, increasing the processing gain of coherent reception, or accurate estimation of the latency of radar signals. Synchronization of clock signals of multiple ICs plays an important role for maintaining coherency among the multiple ICs of a MIMO radar system. A MIMO radar system not properly synchronized or calibrated introduces inherent error and brings severe impact to the performance of the MIMO radar system.

Embodiments herein present methods, apparatus, and systems to synchronize multiple ICs of an electronic/computing platform. The multiple ICs may be a part of a MIMO radar system, which in turn, may be part of a CA/AD vehicle. On the other hand, embodiments herein are not limited to a MIMO radar system and/or CA/AD vehicles. Instead, embodiments herein may be applicable to any electronic/computing platform including multiple ICs.

In embodiments, a distributed local oscillator (LO) is shared among multiple ICs of an electronic/computing (EC) platform to function as a source clock signal for the multiple ICs. An IC of an EC platform includes a measurement circuit, e.g., a time-to-digital converter (TDC), to measure a phase difference or latency difference between two clock signals. TDC is used as an example, and other measurement circuit may be used as well. The IC further includes a synchronization clock generator to generate an operational internal clock signal synchronized with a master clock signal of the EC platform based on the measured phase or latency differences. The master clock signal may be generated by a master clock IC, or by a selected IC of the EC platform. The multiple ICs may form various topology, e.g., a linear topology, a star topology, or a tree topology. Embodiments may be applicable to a MIMO radar system (e.g., a MIMO radar in a CA/AD vehicle) to synchronize multiple ICs of the MIMO radar system when the MIMO radar system is powered up or the LO clock is powered up.

In embodiments, an IC includes a clock divider, a TDC coupled to the clock divider, and a synchronization clock generator. The clock divider is to receive a source clock signal and to generate an initial internal clock signal of the IC. The TDC is to receive the initial internal clock signal and an input clock signal. The input clock signal is synchronized with an operational internal clock signal of another IC or with a master clock signal. The TDC is to measure a phase difference or latency difference between the initial internal clock signal and the input clock signal, and to generate a difference signal to indicate the phase difference or the latency difference. The synchronization clock generator is to generate an operational internal clock signal based on the initial internal clock signal and the difference signal, wherein the operational internal clock signal is synchronized with the master clock signal.

In embodiments, an EC platform includes a controller. The controller is coupled to an IC, and is arranged to generate one or more commands to be sent to the IC for the IC to measure a phase difference or latency difference between an initial internal clock signal of the IC and an input clock signal to the IC. The initial internal clock signal of the IC is generated by the IC based on a source clock signal, and the input clock signal to the IC is synchronized with an operational internal clock signal of a parent IC or with a master clock signal. The parent IC is a parent to the IC in a topology including the IC and the parent IC. The controller is further arranged to receive a difference signal from the IC to indicate the phase difference or the latency difference between the initial internal clock signal of the IC and the input clock signal to the IC.

In embodiments, a MIMO radar system includes an IC, and a controller coupled to the IC. The IC includes a clock divider to receive a source clock signal and to generate an initial internal clock signal of the IC. The IC further includes a TDC coupled to the clock divider to receive the initial internal clock signal and an input clock signal, where the input clock signal is synchronized with an operational internal clock signal of another IC or with a master clock signal. The TDC is arranged to measure a phase difference or latency difference between the initial internal clock signal and the input clock signal, and to generate a difference signal to indicate the phase difference or the latency difference. Moreover, the IC further includes a synchronization clock generator to generate an operational internal clock signal based on the initial internal clock signal and the difference signal, wherein the operational internal clock signal is synchronized with the mast clock signal. The controller is to generate one or more commands to be sent to the IC for the IC to measure the phase difference or latency difference.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used hereinafter, including the claims, the term "unit," "engine," "module," or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a general purpose processing unit (GPU), a single-core processor, a dual-core processor, a triple-core processor, a quad-core processor, and/or any other device capable of executing or otherwise operating computer-executable instructions, such as program code, software modules, and/ or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management Systems (EEMSs), electronic/engine control units (ECUs), vehicle-embedded computer devices (VECDs), autonomous or semi-autonomous driving vehicle (hereinafter, simply ADV) systems, in-vehicle navigation systems, electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

As used herein, the term "network element" may be considered synonymous to and/or referred to as a networked computer, networking hardware, network equipment, router, switch, hub, bridge, radio network controller, radio access network device, gateway, server, and/or any other like device. The term "network element" may describe a physical computing device of a wired or wireless communication network and be configured to host a virtual machine. Furthermore, the term "network element" may describe equipment that provides radio baseband functions for data and/or voice connectivity between a network and one or more users. The term "network element" may be considered synonymous to and/or referred to as a "base station." As used herein, the term "base station" may be considered synonymous to and/or referred to as a node B, an enhanced or evolved node B (eNB), next generation nodeB (gNB), base transceiver station (BTS), access point (AP), roadside unit (RSU), etc., and may describe equipment that provides the radio baseband functions for data and/or voice connectivity between a network and one or more users. As used herein, the terms "vehicle-to-vehicle" and "V2V" may refer to any communication involving a vehicle as a source or destination of a message. Additionally, the terms "vehicle-to-vehicle" and "V2V" as used herein may also encompass or be equivalent to vehicle-to-infrastructure (V2I) communications, vehicle-to-network (V2N) communications, vehicle-to-pedestrian (V2P) communications, or V2X communications As used herein, the term "channel" may refer to any transmission medium, either tangible or intangible, which is used to communicate data or a data stream. The term "channel" may be synonymous with and/or equivalent to "communications channel," "data communications channel," "transmission channel," "data transmission channel," "access channel," "data access channel," "link," "data link," "carrier," "radiofrequency carrier," and/or any other like term denoting a pathway or medium through which data is communicated. Additionally, the term "link" may refer to a connection between two devices through a Radio Access Technology (RAT) for the purpose of transmitting and receiving information.

FIG. 1 illustrates an example IC 101 with a synchronization clock generator 117 to generate an operational internal clock signal 135 synchronized with a master clock signal 141, in accordance with various embodiments.

Figure 5:
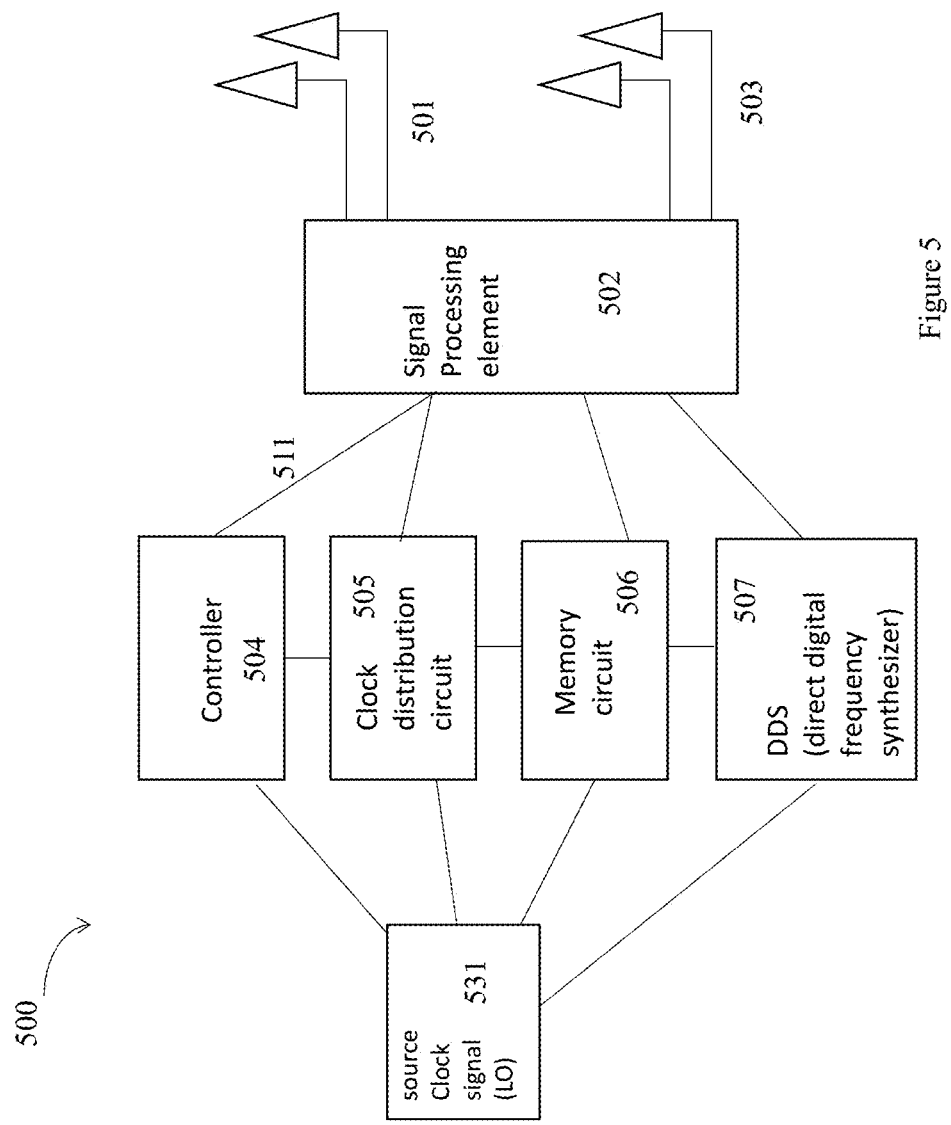
FIG. 5 illustrates an example multiple-input multiple-output (MIMO) radar system including multiple ICs synchronized to an operational internal clock signal of an IC with a master clock signal, in accordance with various embodiments.

In embodiments, an EC platform 100 includes the IC 101, a controller 103, a parent IC 105, a child IC 107, and an optional master clock IC 109. The parent IC 105 and the optional master clock IC 109 may be coupled to a selector 108, e.g., a multiplexer. The master clock IC 109 may be a dedicated IC to provide a master clock signal 141. The IC 101, the parent IC 105, and the child IC 107 are members of a set of ICs that form a topology, and the parent IC 105 or the child IC 107 is a parent or a child in the topology formed by the set of ICs. For example, the IC 101, the parent IC 105, and the child IC 107 are included in a transmitter or a receiver of a MIMO radar system as shown in FIG. 5. In some embodiments, the IC 101 is a part of a vehicle onboard unit (OBU) disposed in a CA/AD vehicle, as shown in FIG. 8.

In embodiments, the IC 101 includes a clock divider 111, a TDC 113, an analog block 121, a digital block 123, the synchronization clock generator 117, an output clock signal generator 115, and a control unit 119.

Figure 3:
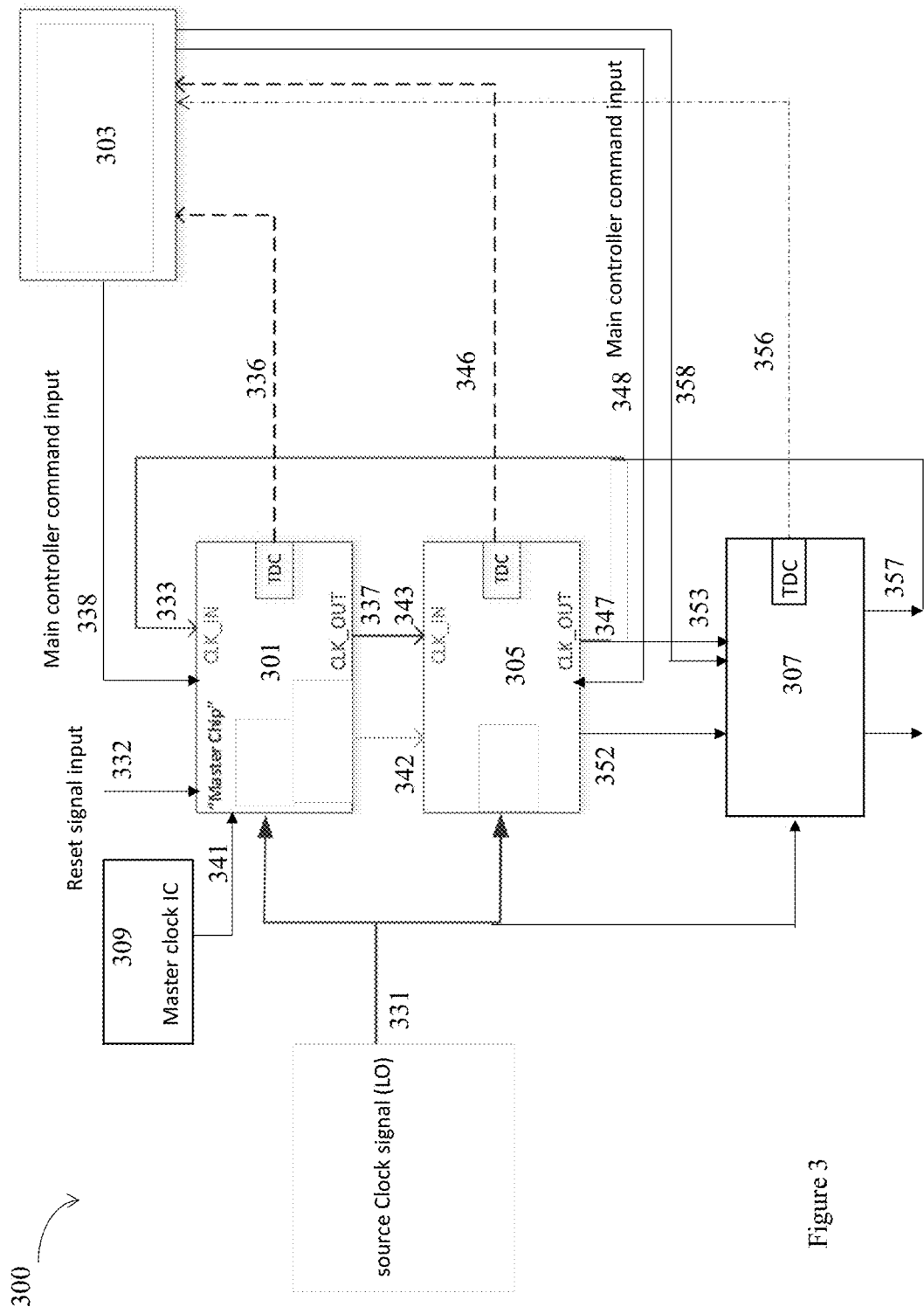
FIG. 3 illustrates example circuitry including a controller to control multiple ICs to synchronize an operational internal clock signal of an IC with a master clock signal, in accordance with various embodiments.

In embodiments, the clock divider 111 is to receive a source clock signal 131 and to generate an initial internal clock signal 134. The source clock signal 131 may be a distributed LO signal shared by multiple ICs, e.g., shared with the parent IC 105, the child IC 107, as shown in FIG. 3. The clock divider 111 may also receive a reset signal 132.

Figure 2:
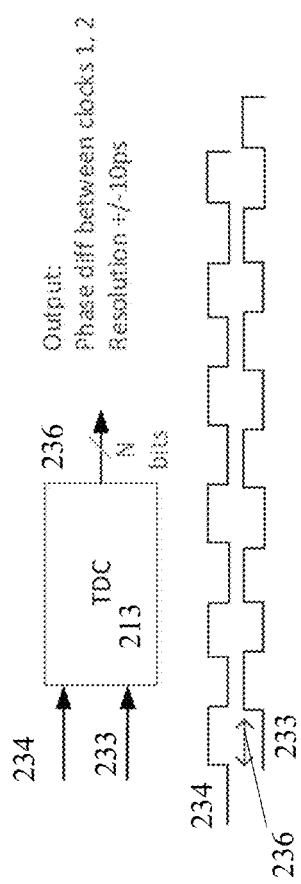
FIG. 2 illustrates an example time-to-digital converter (TDC) to generate a signal to indicate a phase or latency difference between two clock signals, in accordance with various embodiments.

In embodiments, the TDC 113 is to receive the initial internal clock signal 134, and also receive an input clock signal 133. The source clock signal 131, the initial internal clock signal 134, and the input clock signal 133 may be edge-aligned. Based on the control to the selector 108, the input clock signal 133 may be synchronized with an operational internal clock signal 143 of the parent IC 105 or with the master clock signal 141 generated by the master clock IC 109. The TDC 113 is to measure a phase difference or latency difference between the initial internal clock signal 134 and the input clock signal 133, and to generate a difference signal 136 to indicate the phase difference or the latency difference. FIG. 2 illustrates an example TDC 213, which may be an example of the TDC 113, to generate a phase difference between two clock signals, e.g., a signal 233 and a signal 234 with a phase difference 236. The TDC 213 may generate N-bits digital output to represent the phase difference between the signal 233 and the signal 234. In some embodiments, the TDC may include a counter, a statistical counter, a ramp interpolator, or a Vernier interpolator.

In embodiments, the controller 103 is to receive the difference signal 136. In some embodiments, the controller 103 is to determine an adjustment phase or latency for the IC 101 to generate the operational internal clock signal 135 to be synchronized with the master clock signal 141. In some embodiments, the controller 103 may be a part of the IC 101. In some other embodiments, the controller 103 may be shared by more than one IC, e.g., shared by the parent IC 105, the child IC 107, and the IC 101.

In embodiments, the control unit 109 is to receive a command or data 138 from the controller 103 indicating the adjustment phase or latency for the IC 101 to generate the operational internal clock signal 135 to be synchronized with the master clock signal 141. In addition, the control unit 109 is further to receive a command from the controller 103 to have the TDC 113 measure the phase difference or latency difference between the initial internal clock signal 134 and the input clock signal 133 to generate the difference signal 136. The control unit 109 may further provide the synchronization clock generator 117 with an indication 139 of the adjustment phase or latency for the IC 101 to generate the operational internal clock signal 135 to be synchronized with the master clock signal 141.

In embodiments, the synchronization clock generator 117 is to generate the operational internal clock signal 135 based on the initial internal clock signal 134 and the difference signal 136. The operational internal clock signal 135 is synchronized with the master clock signal 141. The synchronization clock generator 117 includes one or more configurable delay lines 118 within the digital block 123 to generate the operational internal clock signal 135 synchronized with the master clock signal 141. Additional and alternatively, the synchronization clock generator 117 includes one or more phase interpolators or phase mux selects 116 within the analog block 121 to generate the operational internal clock signal 135 synchronized with the master clock signal 141.

In embodiments, the output clock signal generator 115 is coupled to the synchronization clock generator 117 to receive the initial internal clock signal 134, the operational internal clock signal 135, and to generate an output clock signal 137, wherein the output clock signal 137 is synchronized either with the initial internal clock signal 134 of the IC 101, the operational internal clock signal 135, or with the master clock signal 141. The output clock signal 137 may be provided to the child IC 107 as an input clock signal, similar to the input clock signal 133 to the IC 101.

In embodiments, the digital block 123 includes a digital circuit 124 and coupled to the clock divider 111 and the synchronization clock generator 117, where the operational internal clock signal 135 generated by the synchronization clock generator 117 is supplied to the digital circuits 124 of the digital block 123.

In embodiments, the analog block 121 includes an analog circuit 122 and coupled to the source clock signal 131, where the source clock signal 131 is supplied to the analog circuits 122 of the analog block 121.

FIG. 3 illustrates example circuitry 300 including a controller 303 to control multiple ICs, an IC 301, an IC 305, an IC 307, to synchronize an operational internal clock signal of an IC with a master clock signal 341, in accordance with various embodiments. In embodiments, the circuitry 300 includes the controller 303, the IC 301, the IC 305, the IC 307, a master clock IC 309, which may be examples of the controller 103, the IC 101, and the master clock IC 109, as shown in FIG. 1.

In embodiments, the IC 301, the IC 305, and the IC 307 are just examples of a set of multiple ICs of the computing platform 300. The computing platform may further include more ICs, not shown in FIG. 3. The multiple ICs, e.g., the IC 301, the IC 305, and the IC 307 form a linear array topology, so that the IC 301 is a parent of the IC 305, and the IC 305 is a parent of the IC 307. In some embodiments, in a circular way, the IC 307 may behave like a parent for the IC 301. On the other hand, the IC 305 is a child of the IC 301, the IC 307 is a child of the IC 305. In some other embodiments, the multiple ICs of the computing platform 300 may form other topology, e.g., a star topology, or a tree topology, so that a parent or ancestor and a child relationship may exist between two ICs, which indicates the order of synchronization between ICs.

In embodiments, the IC 301 receives a source clock signal 331, an input clock signal 333, a command signal 338, a reset signal 332, and the master clock signal 341, and generates an output clock signal 337, a synchronized reset signal 342, and a difference signal 336. In addition, the IC 305 receives the source clock signal 331, an input clock signal 343 that is the output clock signal 337, a command signal 348, a reset signal 342, and generates an output clock signal 347, a synchronized reset signal 352, and a difference signal 346. Similarly, the IC 307 receives the source clock signal 331, an input clock signal 353 that is the output clock signal 347, a command signal 358, a reset signal 352, and generates an output clock signal 357, and a difference signal 356. The output clock signal 357 may be used as the input clock signal 333 to the IC 301.

In embodiments, the source clock signal 331 is a distributed LO signal shared by multiple ICs, e.g., the IC 301, the IC 305, and the IC 307. In some embodiments, e.g., when the computing platform 300 is a part of a MIMO radar system, a distributed LO shared among different ICs in the platform can maintain same phase noise between the transmitted up-conversion and the receivers down conversion at high frequencies, usually high frequency 10 GHz-20 Ghz. In many cases the LO distributed clock is also the source clock for the data path of the multiple ICs.

In embodiments, the IC 301, the IC 305, and the IC 307 may perform various functions. For example, the IC 301, the IC 305, and the IC 307 may be a part of a MIMO radar system shown in FIG. 5. In addition, each IC of the set of ICs in the computing platform 300, the IC 301, the IC 305, and the IC 307, may be an example of the IC 101, and include some common components, e.g., a clock divider, a TDC, an analog block, a digital block, a synchronization clock generator, an output clock signal generator, and a control unit, which are not shown in details.

For example, in detail, a clock divider within the IC 301 receives the source clock signal 331 and generates an initial internal clock signal. The IC 301 also receives the reset signal 332 to reset the clock divider and generate the initial internal clock signal. The IC 301 receives one or more commands, e.g., by a control unit of the IC 301, from the controller 303 through the command signal 338. The commands may instruct the IC 301 to measure, e.g., by a TDC, a phase difference or latency difference between the initial internal clock signal of the IC 301 and the input clock signal 333. Based on the measurement, the IC 301 further generates the difference signal 336 to indicate the phase difference or the latency difference between the initial internal clock signal and the input clock signal 333. In addition, the IC 301 further generates the output clock signal 337, which is provided to the IC 305 as an input clock signal 343. Similarly, the IC 305 or the IC 307 also receives similar input signals and generates similar output signals, as described for the IC 301.

In addition, internally, the IC 301, or the synchronization clock generator of the IC 301, generates an operational internal clock signal based on the initial internal clock signal and the difference signal 336. Based on the difference signal 336, an adjustment phase or latency for the IC 301 may be determined by the controller 303 and transmitted to the IC 301 to generate the operational internal clock signal synchronized with the master clock signal 341. Similarly, the IC 305 or the IC 307 perform similar functions based on the input signals and generate the corresponding output signals. For example, the IC 305 or the IC 307 also generates an operational internal clock signal based on the corresponding initial internal clock signal and the difference signal, where the operational internal clock signal is synchronized with the master clock signal 341.

In embodiments, when the master clock IC 309 is a dedicated clock IC to generate the master clock signal 341, the controller 303 controls the IC 301, the IC 305, or the IC 307 to generate the operational internal clock signal synchronized with the master clock signal 141. The master clock IC 309 is optional. In some embodiments, when there is no dedicated master clock IC 309, the controller 303 may select an IC of the set of ICs as a master IC, where an operational internal clock of the master IC is treated as the master clock signal. In that case, the master clock signal 341 is an initial internal clock signal of the master IC generated by a clock divider of the master IC based on the source clock signal.

Figure 4:
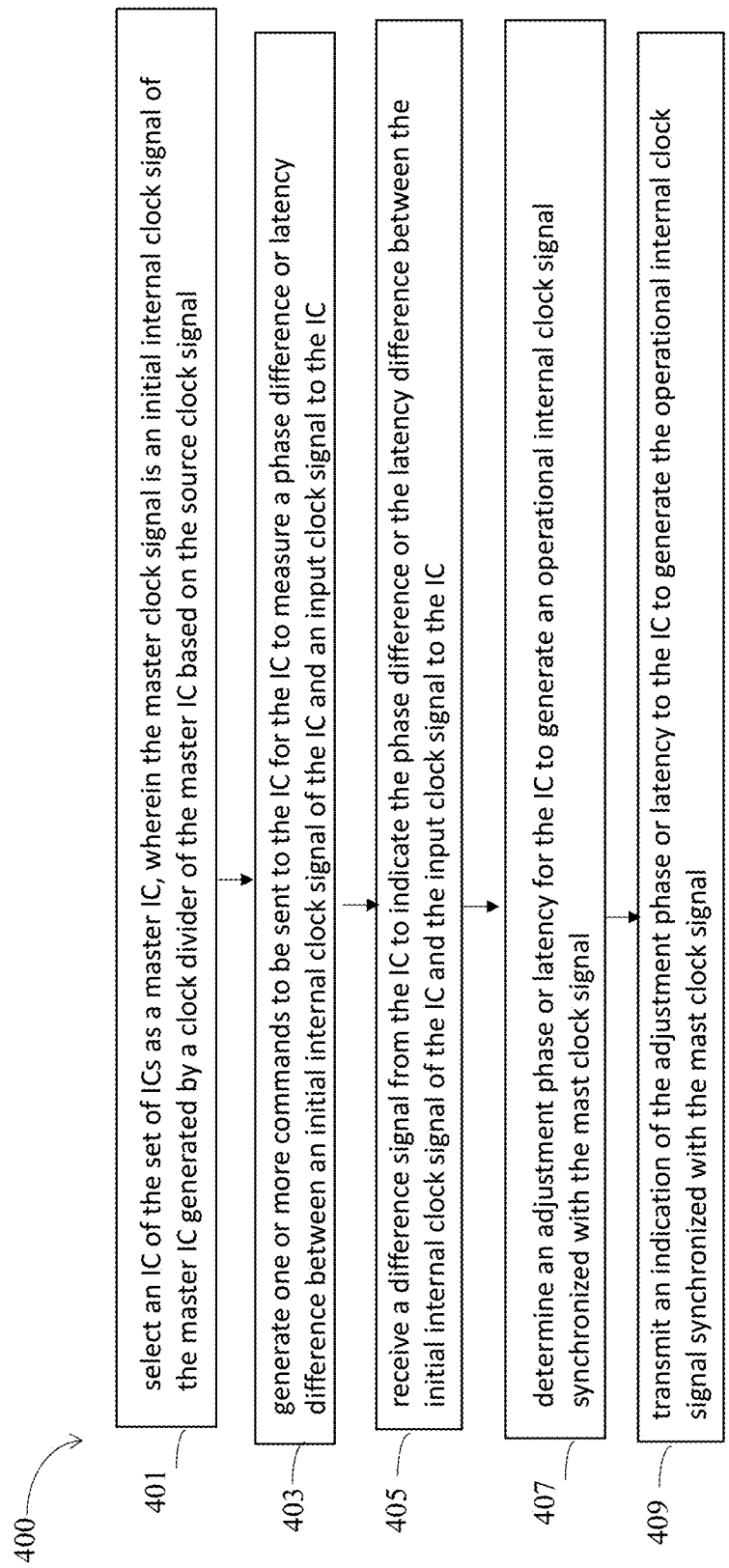
FIG. 4 illustrates an example process to be performed by a controller to control multiple ICs to synchronize an operational internal clock signal of an IC with a master clock signal, in accordance with various embodiments.

In embodiments, as shown in FIG. 4, the controller 303 is to perform the process 400 to control multiple ICs, the IC 301, the IC 305, or the IC 307, to synchronize an operational internal clock signal of an IC with a master clock signal, e.g., the master clock signal 341.

During an interaction 401, operations may be performed by the controller to select an IC of the set of ICs as a master IC, where the master clock signal is an initial internal clock signal of the master IC generated by a clock divider of the master IC based on the source clock signal. For example, the master clock signal 341 is generated by a master IC as its initial internal clock signal. The controller 303 selects the master IC from the set of ICs including the IC 301, the IC 305, the IC 307, the master IC, and more. Interaction 401 may be optional and may not be needed for some embodiments.

During an interaction 403, operations may be performed by the controller to generate one or more commands to be sent to the IC for the IC to measure a phase difference or latency difference between an initial internal clock signal of the IC and an input clock signal to the IC. For example, at the interaction 403, the controller 303 generates one or more commands to be sent through the command signal 338 to the IC 301 for the IC 301 to measure a phase difference or latency difference between an initial internal clock signal of the IC 301 and the input clock signal 333. Similarly, the controller 303 generates one or more commands to be sent to the IC 305 and the IC 307 for the IC to measure a phase difference or latency difference.

During an interaction 405, operations may be performed to receive a difference signal from the IC to indicate the phase difference or the latency difference between the initial internal clock signal of the IC and the input clock signal to the IC. For example, at the interaction 405, the controller 303 receives the difference signal 336 from the IC 301 to indicate the phase difference or the latency difference between the initial internal clock signal of the IC 301 and the input clock signal 333. Similarly, the controller 303 receives the difference signal 346 from the IC 305, and the difference signal 356 from the IC 307.

During an interaction 407, operations may be performed to determine an adjustment phase or latency for the IC to generate an operational internal clock signal synchronized with the mast clock signal. For example, at the interaction 407, the controller 303 determines an adjustment phase or latency for the IC 301 to generate an operational internal clock signal synchronized with the mast clock signal 341. Similarly, the controller 303 determines an adjustment phase or latency for the IC 305 or the IC 307 to generate an operational internal clock signal synchronized with the mast clock signal 341.

During an interaction 409, operations may be performed to transmit an indication of the adjustment phase or latency to the IC to generate the operational internal clock signal synchronized with the mast clock signal. For example, at the interaction 409, the controller 303 transmits, through the command signal 338, an indication of the adjustment phase or latency to the IC 301 to generate the operational internal clock signal synchronized with the mast clock signal 341. Similarly, the controller 303 transmits, through the command signal 348, an indication to the IC 305, and transmits, through the command signal 358, an indication to the IC 307.

In embodiments, there may be different ways to implement the sequence of the interaction 403, the interaction 405, the interaction 407, and the interaction 409. In some embodiments, the controller may perform the interaction 403, the interaction 405, the interaction 407, and the interaction 409 in parallel to multiple ICs. For example, the controller 303 may in parallel, generate one or more commands to be sent through the command signal 338 to the IC 301 for the IC 301 to measure a phase difference or latency difference, generate one or more commands to be sent through the command signal 348 to the IC 305 for the IC 305 to measure a phase difference or latency difference, and generate one or more commands to be sent through the command signal 358 to the IC 307 for the IC 307 to measure a phase difference or latency difference. Afterwards, the IC 301, may measure, e.g., by a TDC, a phase difference or latency difference between the initial internal clock signal of the IC 301 and the input clock signal 333, and further generate the difference signal 336 to indicate the phase difference or the latency difference. Similarly, the IC 305 and the IC 307 may perform such actions of measuring difference and generate the difference signals in parallel. The controller 303 may further receive the difference signal 336 from the IC 301, the difference signal 346 from the IC 305, and the difference signal 346 from the IC 307, in parallel. The controller 303 determines an adjustment phase or latency for the IC 301, the IC 305, and the IC 307, to generate an operational internal clock signal synchronized with the mast clock signal 341, and transmits an indication of the adjustment phase or latency to the IC to generate the operational internal clock signal synchronized with the mast clock signal. For example, as shown in the following table, the first column lists a number of ICs identified by a chip number. The second column shows the measured phase difference or latency difference between the initial internal clock signal of the IC and the input clock signal from a parent IC or the master clock IC. The third column shows the determined adjustment phase or latency for the IC to generate an operational internal clock signal synchronized with the mast clock signal.

| Chip | Measured Latency (to previous chip) | Main controller post process fix commands to chips |
|---|---|---|
| Master (Baseline) | — | 0 |
| 1 | +150 ps | −150 |
| 2 | −650 ps | +500 |
| 3 | +20 ps | +480 |
| ... | | ... |
| N | −500 ps | ... |

In some other embodiments, the controller 303 may control the IC 301, the IC 305, and the IC 307 to operate in sequence. For example, the controller 303 may generate one or more commands to be sent through the command signal 338 to the IC 301 for the IC 301 to measure a phase difference or latency difference. Afterwards, the IC 301, may measure, e.g., by a TDC, a phase difference or latency difference between the initial internal clock signal of the IC 301 and the input clock signal 333, and further generate the difference signal 336 to indicate the phase difference or the latency difference. The controller 303 may further receive the difference signal 336 from the IC 301, and determine an adjustment phase or latency for the IC 301 to generate an operational internal clock signal synchronized with the mast clock signal 341. The controller 303 transmits an indication of the adjustment phase or latency to the IC 301 to generate the operational internal clock signal synchronized with the mast clock signal. Afterwards, the IC 301 may generate an operational internal clock signal based on the initial internal clock signal and the indication of the adjustment phase or latency. After the IC 301 has generated the operational internal clock signal synchronized with the mast clock signal 341, the controller 303 may perform the same sequence of operations for IC 305 as just described for the IC 301. Accordingly, in general, a parent IC has its operational internal clock signal synchronized with the master clock signal first, and afterwards, a child IC will be synchronized with the master clock signal. At the end of this process, each IC has its operational internal clock signal synchronized with the master clock signal.

In some embodiments, the controller 303 may not be needed. For example, the IC 301, the IC 305, or the IC 307 may include discrete lines between a pair of ICs to trigger sequentially chip after chip to measure the differences between signals and to adjust the operational internal clock signal synchronized with the master clock signal.

FIG. 5 illustrates an example MIMO radar system 500 including multiple ICs to synchronize an operational internal clock signal of an IC with a master clock signal, in accordance with various embodiments.

In embodiments, the MIMO radar system 500 includes a plurality of transmitters 501 for transmitting electromagnetic radiation towards a region of interest, and a plurality of receivers 503 for receiving a portion of the transmitted electromagnetic radiation that is reflected back from the region of interest. Based on the signals transmitted by the transmitters 501 and signals received by the receivers 503, the MIMO radar system 500 is capable of spatially mapping out the region of interest or objects within the region of interest. In addition, the MIMO radar system 500 includes at least a signal processing IC 502, a source clock signal generator 531, a controller 504, a clock distribution IC 505, a memory device IC 506, and a direct digital frequency synthesizer (DDS) IC 507. Typically, the MIMO radar system 500 has a large number of ICs, which are not synchronized. The connections between the ICs merely show the ICs are coupled together to form a topology, and do not show the details of the connections between two ICs, which may include a source clock signal, an input clock signal, a command signal, a reset signal, a master clock signal, an output clock signal, a synchronized reset signal, a difference signal, or other signals.

The clock distribution IC 505 may manage the deployment of distributed high frequency clock across the MIMO radar system 500. In embodiments, the MIMO radar system 500 may consume a large amount of power due to the distributed high frequency clock across the system. In some embodiments, the MIMO radar system 500 may turn off the source clock signal generator 531 between transmission activities of the MIMO radar system 500. Since the coherency of the system need to be maintained for each time the LO clock is switched ON, a fast, efficient and robust mechanism to align the platform elements internal clocks for coherency may be needed. Embodiments herein present such mechanisms to synchronize an operational internal clock signal of an IC with a master clock signal, which may be applied to the ICs in the MIMO radar system 500. Techniques presented herein may save power for the MIMO radar system 500. In some instances, techniques presented herein allow use to shut down many elements between the frames, leading to about 90% power savings for TX, and about 40% for RX.

Figure 6:
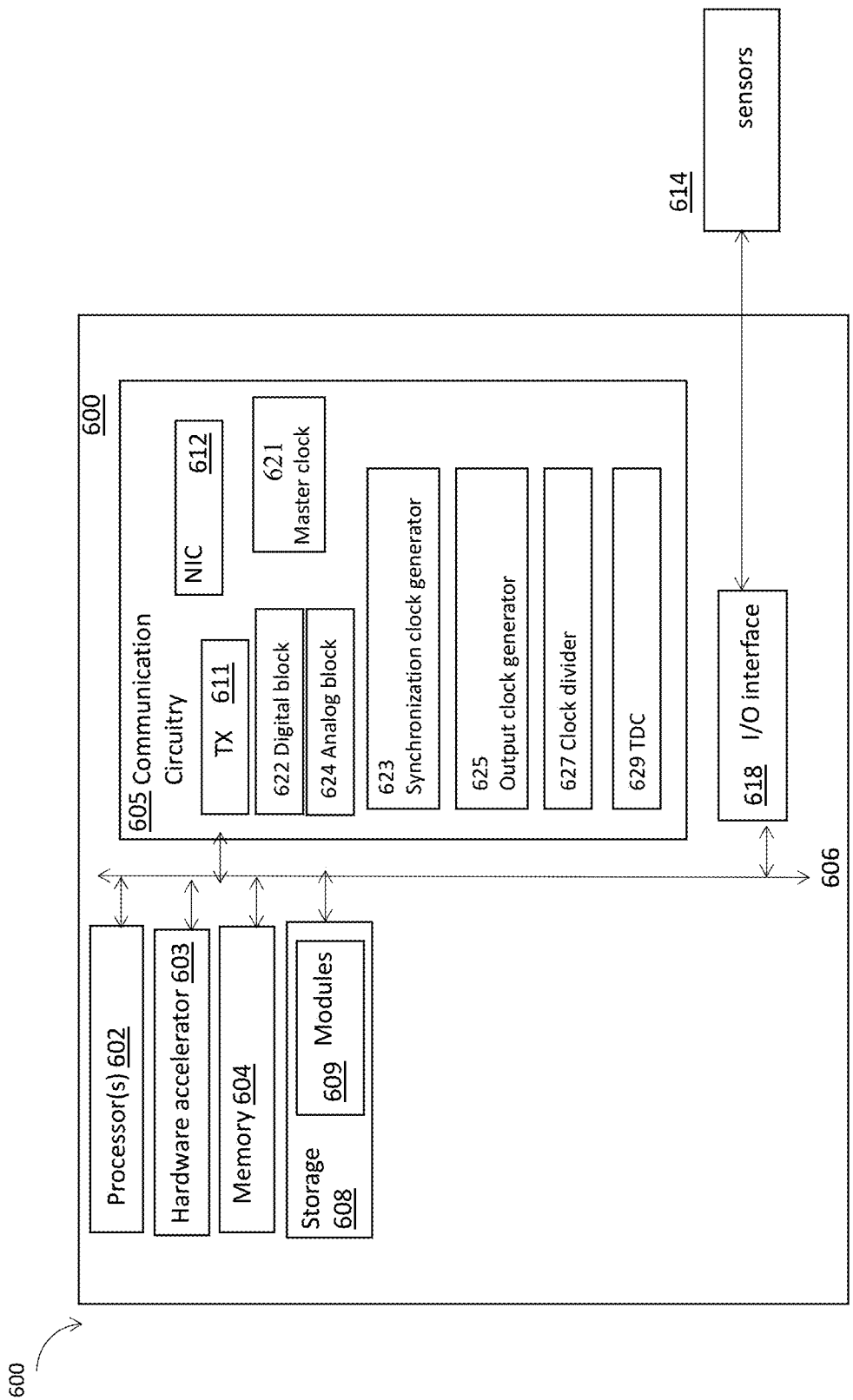
FIG. 6 illustrates an example electronic/computing device suitable for use to practice various aspects of the present disclosure, in accordance with various embodiments.

FIG. 6 illustrates an example computer device 600 that may be suitable as a device to practice selected aspects of the present disclosure. The device 600 may include the EC platform 100 having the IC 101, the controller 103, the IC 105, the IC 107, the master clock IC 109, as shown in FIG. 1, or the circuitry 300 having the controller 303, the IC 301, the IC 305, and the IC 307, in communication circuitry 605, described more fully below.

As shown, the device 600 may include one or more processors 602, each having one or more processor cores, or and optionally, a hardware accelerator 603 (which may be an ASIC or a FPGA). In alternate embodiments, the hardware accelerator 603 may be part of processor 602, or integrated together on a SOC. Additionally, the device 600 may include a memory 604, which may be any one of a number of known persistent storage medium, and a data storage circuitry 608 including modules 609. In addition, the 600 may include an input/output interface 618, coupled to one or more sensors 614. Furthermore, the device 600 may include communication circuitry 605 including a transceiver (Tx/Rx) 611, and network interface controller (NIC) 612. The elements may be coupled to each other via system bus 606, which may represent one or more buses.

In the case of multiple buses, they may be bridged by one or more bus bridges (not shown).

In embodiments, the processor(s) 602 (also referred to as "processor circuitry 602") may be one or more processing elements configured to perform basic arithmetical, logical, and input/output operations by carrying out instructions. Processor circuitry 602 may be implemented as a standalone system/device/package or as part of an existing system/device/package. The processor circuitry 602 may be one or more microprocessors, one or more single-core processors, one or more multi-core processors, one or more multi-threaded processors, one or more GPUs, one or more ultra-low voltage processors, one or more embedded processors, one or more DSPs, one or more FPDs (hardware accelerators) such as FPGAs, structured ASICs, programmable SoCs (PSoCs), etc., and/or other processor or processing/controlling circuit. The processor circuitry 602 may be a part of a SoC in which the processor circuitry 602 and other components discussed herein are formed into a single IC or a single package. As examples, the processor circuitry 602 may include one or more Intel Pentium®, Core®, Xeon®, Atom®, or Core M® processor(s); Advanced Micro Devices (AMD) Accelerated Processing Units (APUs), Epyc®, or Ryzen® processors; Apple Inc. A series, S series, W series, etc. processor(s); Qualcomm Snapdragon® processor(s); Samsung Exynos® processor(s); and/or the like.

In embodiments, the processor circuitry 602 may include a sensor hub, which may act as a coprocessor by processing data obtained from the one or more sensors 614. The sensor hub may include circuitry configured to integrate data obtained from each of the one or more sensors 614 by performing arithmetical, logical, and input/output operations. In embodiments, the sensor hub may capable of timestamping obtained sensor data, providing sensor data to the processor circuitry 602 in response to a query for such data, buffering sensor data, continuously streaming sensor data to the processor circuitry 602 including independent streams for each sensor of the one or more sensors 614, reporting sensor data based upon predefined thresholds or conditions/triggers, and/or other like data processing functions.

In embodiments, the memory 604 (also referred to as "memory circuitry 604" or the like) may be circuitry configured to store data or logic for operating the computer device 600. The memory circuitry 604 may include number of memory devices may be used to provide for a given amount of system memory. As examples, the memory circuitry 604 can be any suitable type, number and/or combination of volatile memory devices (e.g., random access memory (RAM), dynamic RAM (DRAM), static RAM (SAM), etc.) and/or non-volatile memory devices (e.g., read-only memory (ROM), erasable programmable read-only memory (EPROM), electrically erasable programmable read-only memory (EEPROM), flash memory, antifuses, etc.) that may be configured in any suitable implementation as are known. In various implementations, individual memory devices may be formed of any number of different package types, such as single die package (SDP), dual die package (DDP) or quad die package (Q17P), dual inline memory modules (DIMMs) such as microDIMMs or MiniDIMMs, and/or any other like memory devices. To provide for persistent storage of information such as data, applications, operating systems and so forth, the memory circuitry 604 may include one or more mass-storage devices, such as a solid state disk drive (SSDD); flash memory cards, such as SD cards, microSD cards, xD picture cards, and the like, and USB flash drives; on-die memory or registers associated with the processor circuitry 602 (for example, in low power implementations); a micro hard disk drive (HDD); three dimensional cross-point (3D)(POINT) memories from Intel® and Micron®, etc.

Where FPDs are used, the processor circuitry 602 and memory circuitry 604 (and/or data storage circuitry 608) may comprise logic blocks or logic fabric, memory cells, input/output (I/O) blocks, and other interconnected resources that may be programmed to perform various functions of the example embodiments discussed herein. The memory cells may be used to store data in lookup-tables (LUTs) that are used by the processor circuitry 602 to implement various logic functions. The memory cells may include any combination of various levels of memory/storage including, but not limited to, EPROM, EEPROM, flash memory, SRAM, antifuses, etc.

In embodiments, the data storage circuitry 608 (also referred to as "storage circuitry 608" or the like), with shared or respective controllers, may provide for persistent storage of information such as modules 609, operating systems, etc. The data storage circuitry 608 may be implemented as solid state drives (SSDs); solid state disk drive (SSDD); serial AT attachment (SATA) storage devices (e.g., SATA SSDs); flash drives; flash memory cards, such as SD cards, microSD cards, xD picture cards, and the like, and USB flash drives; three-dimensional cross-point (3D Xpoint) memory devices; on-die memory or registers associated with the processor circuitry 602; hard disk drives (HDDs); micro HDDs; resistance change memories; phase change memories; holographic memories; or chemical memories; among others. As shown, the data storage circuitry 608 is included in the computer device 600; however, in other embodiments, the data storage circuitry 608 may be implemented as one or more devices separated from the other elements of computer device 600.

In some embodiments, the data storage circuitry 608 may include an operating system (OS) (not shown), which may be a general purpose operating system or an operating system specifically written for and tailored to the computer device 600. The OS may include one or more drivers, libraries, and/or application programming interfaces (APIs), which provide program code and/or software components for modules 609 and/or control system configurations to control and/or obtain/process data from the one or more sensors 614.

The modules 609 may be software modules/components used to perform various functions of the computer device 600 and/or to carry out functions of the example embodiments discussed herein. In embodiments where the processor circuitry 602 and memory circuitry 604 includes hardware accelerators (e.g., FPGA cells, the hardware accelerator 603) as well as processor cores, the hardware accelerators (e.g., the FPGA cells) may be pre-configured (e.g., with appropriate bit streams, logic blocks/fabric, etc.) with the logic to perform some functions of the embodiments herein (in lieu of employment of programming instructions to be executed by the processor core(s)). For example, the modules 609 may comprise logic for the corresponding entities discussed with regard to the controller 103, the control unit 119, the controller 303, as shown in FIGS. 1-3.

The components of computer device 600 may communicate with one another over the bus 606. The bus 606 may include any number of technologies, such as a Local Interconnect Network (LIN); industry standard architecture (ISA); extended ISA (EISA); PCI; PCI extended (PCIx); PCIe; an Inter-Integrated Circuit (I2C) bus; a Parallel Small Computer System Interface (SPI) bus; Common Application Programming Interface (CAPI); point to point interfaces; a power bus; a proprietary bus, for example, Intel® Ultra Path Interface (UPI), Intel® Accelerator Link (IAL), or some other proprietary bus used in a SoC based interface; or any number of other technologies. In some embodiments, the bus 606 may be a controller area network (CAN) bus system, a Time-Trigger Protocol (TTP) system, or a FlexRay system, which may allow various devices (e.g., the one or more sensors 614, etc.) to communicate with one another using messages or frames.

The communications circuitry 605 may include circuitry for communicating with a wireless network or wired network. For example, the communication circuitry 605 may include transceiver (Tx/Rx) 611 and network interface controller (MC) 612. Communications circuitry 605 may include one or more processors (e.g., baseband processors, modems, etc.) that are dedicated to a particular wireless communication protocol. For the illustrated embodiments, communication circuitry 605 includes a clock divider 627, a TDC 629, an analog block 622, a digital block 624, a synchronization clock generator 623, an output clock signal generator 625, and a master clock IC 621, which may be similar to the clock divider 111, the TDC 113, the analog block 121, the digital block 123, the synchronization clock generator 117, the output clock signal generator 115, and a master clock IC 109, arranged to synchronize various ICs within communication circuitry 605 as described earlier, e.g., within Tx/Rx 611 and/or NIC 612.

NIC 612 may be included to provide a wired communication link to a network and/or other devices. The wired communication may provide an Ethernet connection, an Ethernet-over-USB, and/or the like, or may be based on other types of networks, such as DeviceNet, ControlNet, Data Highway+, PROFIBUS, or PROFINET, among many others. An additional NIC 612 may be included to allow connect to a second network (not shown) or other devices, for example, a first NIC 612 providing communications to the network over Ethernet, and a second NIC 612 providing communications to other devices over another type of network, such as a personal area network (PAN) including a personal computer (PC) device. In some embodiments, the various components of the device 600, such as the one or more sensors 614, etc. may be connected to the processor(s) 602 via the NIC 612 as discussed above rather than via the I/O circuitry 618 as discussed infra.

The Tx/Rx 611 may include one or more radios to wirelessly communicate with a network and/or other devices. The Tx/Rx 611 may include hardware devices that enable communication with wired networks and/or other devices using modulated electromagnetic radiation through a solid or non-solid medium. Such hardware devices may include switches, filters, amplifiers, antenna elements, and the like to facilitate the communications over the air (OTA) by generating or otherwise producing radio waves to transmit data to one or more other devices, and converting received signals into usable information, such as digital data, which may be provided to one or more other components of computer device 600. In some embodiments, the various components of the device 600, such as the one or more sensors 614, etc. may be connected to the device 600 via the Tx/Rx 611 as discussed above rather than via the I/O circuitry 618 as discussed infra. In one example, the one or more sensors 614 may be coupled with device 600 via a short range communication protocol.

The Tx/Rx 611 may include one or multiple radios that are compatible with any number of 3GPP (Third Generation Partnership Project) specifications, notably Long Term Evolution (LTE), Long Term Evolution-Advanced (LTE-A), Long Term Evolution-Advanced Pro (LTE-A Pro), and Fifth Generation (5G) New Radio (NR). It can be noted that radios compatible with any number of other fixed, mobile, or satellite communication technologies and standards may be selected. These may include, for example, any Cellular Wide Area radio communication technology, which may include e.g. a 5G communication systems, a Global System for Mobile Communications (GSM) radio communication technology, a General Packet Radio Service (GPRS) radio communication technology, or an Enhanced Data Rates for GSM Evolution (EDGE) radio communication technology. Other Third Generation Partnership Project (3GPP) radio communication technology that may be used includes UMTS (Universal Mobile Telecommunications System), FOMA (Freedom of Multimedia Access), 3GPP LTE (Long Term Evolution), 3GPP LTE Advanced (Long Term Evolution Advanced), 3GPP LTE Advanced Pro (Long Term Evolution Advanced Pro)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSUPA (High-Speed Uplink Packet Access), HSPA+(High Speed Packet Access Plus), UMTS-TDD (Universal Mobile Telecommunications System-Time-Division Duplex), TD-CDMA (Time Division-Code Division Multiple Access), TD-SCDMA (Time Division-Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), IMTS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handy-phone System), WiDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.11ad, IEEE 802.11ay, and the like. In addition to the standards listed above, any number of satellite uplink technologies may be used for the uplink transceiver, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated. Implementations, components, and details of the aforementioned protocols may be those known in the art and are omitted herein for the sake of brevity.

The input/output (I/O) interface 618 may include circuitry, such as an external expansion bus (e.g., Universal Serial Bus (USB), FireWire, Thunderbolt, PCI/PCIe/PCIx, etc.), used to connect computer device 600 with external components/devices, such as one or more sensors 614, etc. I/O interface circuitry 618 may include any suitable interface controllers and connectors to interconnect one or more of the processor circuitry 602, memory circuitry 604, data storage circuitry 608, communication circuitry 605, and the other components of computer device 600. The interface controllers may include, but are not limited to, memory controllers, storage controllers (e.g., redundant array of independent disk (RAID) controllers, baseboard management controllers (BMCs), input/output controllers, host controllers, etc. The connectors may include, for example, busses (e.g., bus 606), ports, slots, jumpers, interconnect modules, receptacles, modular connectors, etc. The I/O circuitry 618 may couple the device 600 with the one or more sensors 614, etc. via a wired connection, such as using USB, FireWire, Thunderbolt, RCA, a video graphics array (VGA), a digital visual interface (DVI) and/or mini-DVI, a high-definition multimedia interface (HDMI), an S-Video, and/or the like.

The one or more sensors 614 may be any device configured to detect events or environmental changes, convert the detected events into electrical signals and/or digital data, and transmit/send the signals/data to the computer device 600. Some of the one or more sensors 614 may be sensors used for providing computer-generated sensory inputs. Some of the one or more sensors 614 may be sensors used for motion and/or object detection. Examples of such one or more sensors 614 may include, inter alia, charged-coupled devices (CCD), Complementary metal-oxide-semiconductor (CMOS) active pixel sensors (APS), lens-less image capture devices/cameras, thermographic (infrared) cameras, Light Imaging Detection And Ranging (LIDAR) systems, and/or the like. In some implementations, the one or more sensors 614 may include a lens-less image capture mechanism comprising an array of aperture elements, wherein light passing through the array of aperture elements define the pixels of an image. In embodiments, the motion detection one or more sensors 614 may be coupled with or associated with light generating devices, for example, one or more infrared projectors to project a grid of infrared light onto a scene, where an infrared camera may record reflected infrared light to compute depth information.

Some of the one or more sensors 614 may be used for position and/or orientation detection, ambient/environmental condition detection, and the like. Examples of such one or more sensors 614 may include, inter alia, microelectromechanical systems (MEMS) with piezoelectric, piezoresistive and/or capacitive components, which may be used to determine environmental conditions or location information related to the computer device 600. In embodiments, the MEMS may include 3-axis accelerometers, 3-axis gyroscopes, and/or magnetometers. In some embodiments, the one or more sensors 614 may also include one or more gravimeters, altimeters, barometers, proximity sensors (e.g., infrared radiation detector(s) and the like), depth sensors, ambient light sensors, thermal sensors (thermometers), ultrasonic transceivers, and/or the like.

Each of these elements, e.g., one or more processors 602, the hardware accelerator 603, the memory 604, the data storage circuitry 608 including the modules 609, the input/output interface 618, the one or more sensors 614, the communication circuitry 605 including the Tx/Rx 611, and the NIC 612, and the system bus 606, may perform its conventional functions known in the art. In addition, they may be employed to store and host execution of programming instructions implementing the operations associated with operations to be performed by an apparatus for computer assisted or autonomous driving, and/or other functions that provides the capability of the embodiments described in the current disclosure. The various elements may be implemented by assembler instructions supported by processor(s) 602 or high-level languages, such as, for example, C, that can be compiled into such instructions. Operations associated with safety operations and configuration of safety operations not implemented in software may be implemented in hardware, e.g., via hardware accelerator 603.

The number, capability and/or capacity of these elements 602-629 may vary, depending on the number of other devices the device 600 is configured to support. Otherwise, except for the teachings of the present disclosure, the constitutions of elements 602-629 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Figure 7:
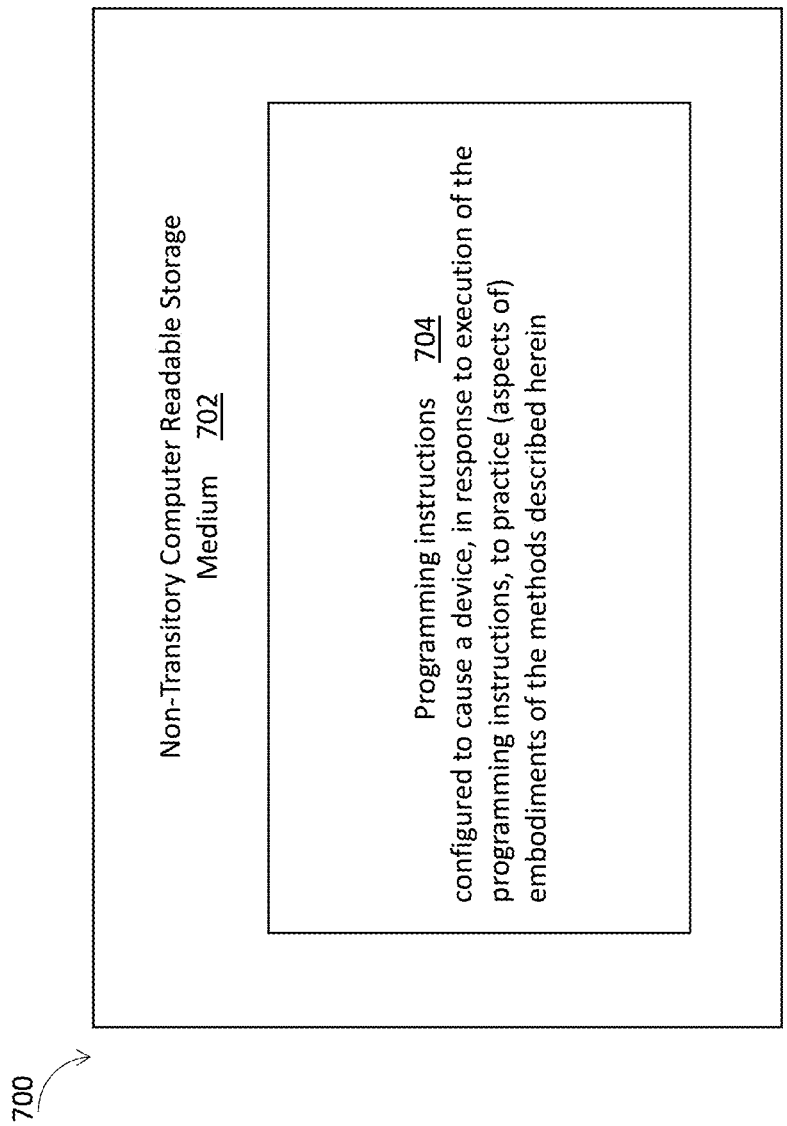
FIG. 7 illustrates a storage medium having instructions for practicing methods described with references to FIGS. 1-6, in accordance with various embodiments.

Furthermore, the present disclosure may take the form of a computer program product embodied in any tangible or non-transitory medium of expression having computer-usable program code embodied in the medium. FIG. 7 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 702 may include a number of programming instructions 704. Programming instructions 704 may be configured to enable a device, e.g., device 600, in response to execution of the programming instructions, to perform, e.g., various operations associated with controlling multiple ICs, the IC 301, the IC 305, the IC 307, to synchronize an operational internal clock signal of an IC with a master clock signal, as shown for the controller 103, the controller 303 to perform the process 400.

In alternate embodiments, programming instructions 704 may be disposed on multiple computer-readable non-transitory storage media 702 instead. In alternate embodiments, programming instructions 704 may be disposed on computer-readable transitory storage media 702, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

FIG. 8 illustrates an environment 800 in which various embodiments described with references to FIGS. 1-7 may be practiced. Environment 800 includes a CA/AD vehicle 801, a wireless access node 803, and a cloud computing service 805 (also referred to as "cloud 805", "the cloud 805", and the like). The CA/AD vehicle 801 may include a MIMO radar system 811, which may be similar to the MIMO radar system 500 as shown in FIG. 5, to detect objects in various regions-of-interest, e.g., objects such as other vehicles, bicycles, pedestrians, road signs, and so forth, in an surrounding area of the vehicle (such as, the front, the rear or the side of the vehicle). The MIMO radar system 811 may include various ICs similar to the IC 101, the IC 301, as shown in FIGS. 1-3. For example, various ICs similar to the IC 101, the IC 301 may be a part of a vehicle onboard unit (OBU) disposed in the CA/AD vehicle 801. For illustrative purposes, the following description may be applicable in a two dimensional (2D) freeway/highway/roadway environment. However, the embodiments described herein may also be applicable to any type of vehicle, such as trucks, buses, motorcycles, boats or motorboats, and/or any other motorized devices with a CA/AD vehicle coupled with a trailer, as illustrated in FIGS. 1-7.

The CA/AD vehicle 801 may be any type of motorized vehicle or device used for transportation of people or goods, which may be equipped with controls used for driving, parking, passenger comfort and/or safety, etc. The terms "motor", "motorized", etc., as used herein may refer to devices that convert one form of energy into mechanical energy, and may include internal combustion engines (ICE), compression combustion engines (CCE), electric motors, and hybrids (e.g., including an ICE/CCE and electric motor(s)).

The communications circuitry of the CA/AD vehicle 801 may communicate with the cloud 805 via the wireless access node 803. The wireless access node 803 may be one or more hardware computer devices configured to provide wireless communication services to mobile devices within a coverage area or cell associated with the wireless access node 803. The wireless access node 803 may include a transmitter/receiver (or alternatively, a transceiver) connected to one or more antennas, one or more memory devices, one or more processors, one or more network interface controllers, and/or other like components. The one or more transmitters/receivers may be configured to transmit/receive data signals to/from one or more mobile devices via a link (e.g., link 807). Furthermore, one or more network interface controllers may be configured to transmit/receive with various network elements (e.g., one or more servers within a core network, etc.) over another backhaul connection (not shown). In embodiments, an OBU of the CA/AD vehicle 801 may generate and transmit data to the wireless access node 803 over link 807, and the wireless access node 803 may provide the data to the cloud 805 over backhaul link 809. Additionally, during operation of the an OBU of the CA/AD vehicle 801, the wireless access node 803 may obtain data intended for the OBU of the CA/AD vehicle from the cloud 805 over link 809, and may provide that data to the OBU of the CA/AD vehicle 801 over link 807. The communications circuitry in the CA/AD vehicle 801 may communicate with the wireless access node 803 in accordance with one or more wireless communications protocols as discussed herein.

As an example, the wireless access node 803 may be a base station associated with a cellular network (e.g., an eNB in an LTE network, a gNB in a new radio access technology (NR) network, a WiMAX base station, etc.), an RSU, a remote radio head, a relay radio device, a smallcell base station (e.g., a femtocell, picocell, home evolved nodeB (HeNB), and the like), or other like network element. In embodiments where the wireless access node is a base station, the wireless access node 803 may be deployed outdoors to provide communications for the vehicle 801 when the vehicle 801 is operating at large, for example when deployed on public roads, streets, highways, etc.

In some embodiments, the wireless access node 803 may be a gateway (GW) device that may include one or more processors, communications systems (e.g., including network interface controllers, one or more transmitters/receivers connected to one or more antennas, and the like), and computer readable media. In such embodiments, the GW may be a wireless access point (WAP), a home/business server (with or without radio frequency (RF) communications circuitry), a router, a switch, a hub, a radio beacon, and/or any other like network device. In embodiments where the wireless access node 803 is a GW, the wireless access node 803 may be deployed in an indoor setting, such as a garage, factory, laboratory or testing facility, and may be used to provide communications for while parked, prior to sale on the open market, or otherwise not operating at large.

In embodiments, the cloud 805 may represent the Internet, one or more cellular networks, a local area network (LAN) or a wide area network (WAN) including proprietary and/or enterprise networks, Transfer Control Protocol (TCP)/Internet Protocol (IP)-based network, or combinations thereof. In such embodiments, the cloud 805 may be associated with network operator who owns or controls equipment and other elements necessary to provide network-related services, such as one or more base stations or access points (e.g., wireless access node 803), one or more servers for routing digital data or telephone calls (for example, a core network or backbone network), etc. Implementations, components, and protocols used to communicate via such services may be those known in the art and are omitted herein for the sake of brevity.

In some embodiments, the cloud 805 may be a system of computer devices (e.g., servers, storage devices, applications, etc. within or associated with a data center or data warehouse) that provides access to a pool of computing resources. The term "computing resource" may refer to a physical or virtual component within a computing environment and/or within a particular computer device, such as memory space, processor time, electrical power, input/output operations, ports or network sockets, and the like. In these embodiments, the cloud 805 may be a private cloud, which offers cloud services to a single organization; a public cloud, which provides computing resources to the general public and shares computing resources across all customers/users; or a hybrid cloud or virtual private cloud, which uses a portion of resources to provide public cloud services while using other dedicated resources to provide private cloud services. For example, the hybrid cloud may include a private cloud service that also utilizes one or more public cloud services for certain applications or users, such as providing obtaining data from various data stores or data sources. In embodiments, a common cloud management platform (e.g., implemented as various virtual machines and applications hosted across the cloud 805 and database systems) may coordinate the delivery of data to the OBU of the CA/AD towing vehicle 801 and the OBU of the trailer 811. Implementations, components, and protocols used to communicate via such services may be those known in the art and are omitted herein for the sake of brevity.

Thus various example embodiments of the present disclosure have been described including, but are not limited to:

Example 1 may include an integrated circuit (IC), comprising: a clock divider to receive a source clock signal and to generate an initial internal clock signal of the IC; a time-to-digital converter (TDC) coupled to the clock divider to receive the initial internal clock signal and an input clock signal, wherein the input clock signal is synchronized with an operational internal clock signal of another IC or with a master clock signal, and wherein the TDC is to measure a phase difference or latency difference between the initial internal clock signal and the input clock signal, and to generate a difference signal to indicate the phase difference or the latency difference; and a synchronization clock generator to generate an operational internal clock signal based on the initial internal clock signal and the difference signal, wherein the operational internal clock signal is synchronized with the master clock signal.

Example 2 may include the IC of example 1 and/or some other examples herein, wherein the synchronization clock generator includes one or more configurable delay lines within a digital block to generate the operational internal clock signal synchronized with the master clock signal.

Example 3 may include the IC of example 1 and/or some other examples herein, wherein the synchronization clock generator includes one or more phase interpolators or phase mux selects within an analog block to generate the operational internal clock signal synchronized with the master clock signal.

Example 4 may include the IC of example 1 and/or some other examples herein, further comprising: an output clock signal generator coupled to the synchronization clock generator to receive the initial internal clock signal, and to generate an output clock signal, wherein the output clock signal is synchronized either with the initial internal clock signal of the IC or with the master clock signal.

Example 5 may include the IC of example 1 and/or some other examples herein, further comprising: a digital block including digital circuits and coupled to the clock divider and the synchronization clock generator, wherein the operational internal clock signal generated by the synchronization clock generator is supplied to the digital circuits of the digital block.

Example 6 may include the IC of example 1 and/or some other examples herein, an analog block including analog circuits and coupled to the source clock signal, wherein the source clock signal is supplied to the analog circuits of the analog block.

Example 7 may include the IC of example 1 and/or some other examples herein, wherein the difference signal is transmitted to a controller, and the controller is to determine an adjustment phase or latency for the IC to generate the operational internal clock signal to be synchronized with the master clock signal.

Example 8 may include the IC of example 7 and/or some other examples herein, further comprising: the controller, wherein the controller is to determine the adjustment phase or latency for the IC to generate the operational internal clock signal to be synchronized with the mast clock signal.

Example 9 may include the IC of example 7 and/or some other examples herein, further comprising: a control unit, wherein the control unit is to receive a command from the controller indicating the adjustment phase or latency for the IC to generate the operational internal clock signal to be synchronized with the master clock signal.

Example 10 may include the IC of example 9 and/or some other examples herein, wherein the control unit is further to receive a command from the controller to have the TDC measure the phase difference or latency difference between the initial internal clock signal and the input clock signal.

Example 11 may include the IC of example 1 and/or some other examples herein, wherein the TDC is a counter, a statistical counter, a ramp interpolator, or a Vernier interpolator.

Example 12 may include the IC of example 1 and/or some other examples herein, wherein the source clock signal, the initial internal clock signal, and the input clock signal are edge-aligned.

Example 13 may include the IC of example 1 and/or some other examples herein, wherein the IC and the another IC are included in a transmitter or a receiver of a multiple-input multiple-output (MIMO) radar system.

Example 14 may include the IC of example 13 and/or some other examples herein, wherein the IC is a part of a vehicle onboard unit (OBU) disposed in a computer assisted or autonomous driving (CA/AD) vehicle.

Example 15 may include an electronic/computing (EC) platform, comprising: a controller, wherein the controller is coupled to an integrated circuit (IC), and the controller is arranged to: generate one or more commands to be sent to the IC for the IC to measure a phase difference or latency difference between an initial internal clock signal of the IC and an input clock signal to the IC, wherein the initial internal clock signal of the IC is generated by the IC based on a source clock signal, and the input clock signal to the IC is synchronized with an operational internal clock signal of a parent IC or with a master clock signal, and wherein the parent IC is a parent to the IC in a topology including the IC and the parent IC; and receive a difference signal from the IC to indicate the phase difference or the latency difference between the initial internal clock signal of the IC and the input clock signal to the IC.

Example 16 may include the EC platform of example 15 and/or some other examples herein, wherein the master clock signal is from a dedicated master clock IC coupled to the IC.

Example 17 may include the EC platform of example 15 and/or some other examples herein, wherein the controller is further arranged to: determine an adjustment phase or latency for the IC to generate an operational internal clock signal synchronized with the mast clock signal; and transmit an indication of the adjustment phase or latency to the IC to generate the operational internal clock signal synchronized with the mast clock signal.

Example 18 may include the EC platform of example 17 and/or some other examples herein, wherein the IC is included in a set of ICs that are all coupled to the controller to form the topology, and the controller is further arranged to: generate one or more commands to be sent to one or more ICs of the set of ICs, for each IC of the one or more ICs to measure a phase difference or latency difference between an initial internal clock signal of the each IC and an input clock signal to the each IC, wherein the initial internal clock signal of the each IC is generated by the each IC based on the source clock signal, and the input clock signal to the each IC is synchronized with an operational internal clock signal of a parent IC of the each IC in the topology or with the master clock signal; receive a difference signal from the each IC to indicate the phase difference or the latency difference between the initial internal clock signal of the each IC and the input clock signal to the each IC; determine an adjustment phase or latency for the each IC to generate an operational internal clock signal of the each IC that is synchronized with the mast clock signal; and transmit an indication of the adjustment phase or latency to the each IC to generate the operational internal clock signal of the each IC that is synchronized with the mast clock signal.

Example 19 may include the EC platform of example 18 and/or some other examples herein, wherein the controller is further arranged to: select an IC of the set of ICs as a master IC, wherein the master clock signal is an initial internal clock signal of the master IC generated by a clock divider of the master IC based on the source clock signal.

Example 20 may include the EC platform of example 18 and/or some other examples herein, wherein the topology formed by the set of ICs is a linear array topology, a star topology, or a tree topology.

Example 21 may include the EC platform of example 18 and/or some other examples herein, wherein the input clock signal received from the parent IC is the operational internal clock signal of the parent IC that is synchronized with the master clock signal.

Example 22 may include the EC platform of example 18 and/or some other examples herein, wherein the set of ICs further includes a clock distribution circuit, a memory circuit, or a direct digital frequency synthesizer (DDS).

Example 23 may include a multiple-input multiple-output (MIMO) radar system, comprising: an integrated circuit (IC), comprising: a clock divider to receive a source clock signal and to generate an initial internal clock signal of the IC; a time-to-digital converter (TDC) coupled to the clock divider to receive the initial internal clock signal and an input clock signal, wherein the input clock signal is synchronized with an operational internal clock signal of another IC or with a master clock signal, and wherein the TDC is to measure a phase difference or latency difference between the initial internal clock signal and the input clock signal, and to generate a difference signal to indicate the phase difference or the latency difference; and a synchronization clock generator to generate an operational internal clock signal based on the initial internal clock signal and the difference signal, wherein the operational internal clock signal is synchronized with the mast clock signal; and a controller coupled to the IC, wherein the controller is to generate one or more commands to be sent to the IC for the IC to measure the phase difference or latency difference.

Example 24 may include the MIMO system of example 23 and/or some other examples herein, wherein the controller is to generate the one or more commands to be sent to the IC when the MIMO system is powered up.

Example 25 may include the MIMO system of example 23 and/or some other examples herein, wherein the MIMO system is disposed in a computer assisted or autonomous driving (CA/AD) vehicle.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An integrated circuit (IC), comprising:
    a clock divider to receive a source clock signal and to generate an initial internal clock signal of the IC;
    a time-to-digital converter (TDC) coupled to the clock divider to receive the initial internal clock signal and an input clock signal, wherein the input clock signal is synchronized with an operational internal clock signal of another IC or with a master clock signal, and wherein the TDC is to measure a phase difference or latency difference between the initial internal clock signal and the input clock signal, and to generate a difference signal to indicate the phase difference or the latency difference; and
    a synchronization clock generator to generate an operational internal clock signal based on the initial internal clock signal and the difference signal, wherein the operational internal clock signal is synchronized with the master clock signal.

2. The IC of claim 1, wherein the synchronization clock generator includes one or more configurable delay lines within a digital block to generate the operational internal clock signal synchronized with the master clock signal.

3. The IC of claim 1, wherein the synchronization clock generator includes one or more phase interpolators or phase mux selects within an analog block to generate the operational internal clock signal synchronized with the master clock signal.

4. The IC of claim 1, further comprising:
    an output clock signal generator coupled to the synchronization clock generator to receive the initial internal clock signal, and to generate an output clock signal, wherein the output clock signal is synchronized either with the initial internal clock signal of the IC or with the master clock signal.

5. The IC of claim 1, further comprising:
    a digital block including digital circuits and coupled to the clock divider and the synchronization clock generator, wherein the operational internal clock signal generated by the synchronization clock generator is supplied to the digital circuits of the digital block.

6. The IC of claim 1, further comprising:
    an analog block including analog circuits and coupled to the source clock signal, wherein the source clock signal is supplied to the analog circuits of the analog block.

7. The IC of claim 1, wherein the difference signal is transmitted to a controller, and the controller is to determine an adjustment phase or latency for the IC to generate the operational internal clock signal to be synchronized with the master clock signal.

8. The IC of claim 7, further comprising:
    the controller, wherein the controller is to determine the adjustment phase or latency for the IC to generate the operational internal clock signal to be synchronized with the master clock signal.

9. The IC of claim 7, further comprising:
    a control unit, wherein the control unit is to receive a command from the controller indicating the adjustment phase or latency for the IC to generate the operational internal clock signal to be synchronized with the master clock signal.

10. The IC of claim 9, wherein the control unit is further to receive a command from the controller to have the TDC measure the phase difference or latency difference between the initial internal clock signal and the input clock signal.

11. The IC of claim 1, wherein the TDC is a counter, a statistical counter, a ramp interpolator, or a Vernier interpolator.

12. The IC of claim 1, wherein the source clock signal, the initial internal clock signal, and the input clock signal are edge-aligned.

13. The IC of claim 1, wherein the IC and the another IC are included in a transmitter or a receiver of a multiple-input multiple-output (MIMO) radar system.

14. The IC of claim 13, wherein the IC is a part of a vehicle onboard unit (OBU) disposed in a computer assisted or autonomous driving (CA/AD) vehicle.

15. An electronic/computing (EC) platform, comprising:
a controller, wherein the controller is coupled to an integrated circuit (IC), and the controller is arranged to:
generate one or more commands to be sent to the IC for the IC to measure a phase difference or latency difference between an initial internal clock signal of the IC and an input clock signal to the IC, wherein the initial internal clock signal of the IC is generated by the IC based on a source clock signal, and the input clock signal to the IC is synchronized with an operational internal clock signal of a parent IC or with a master clock signal, and wherein the parent IC is a parent to the IC in a topology including the IC and the parent IC; and
receive a difference signal from the IC to indicate the phase difference or the latency difference between the initial internal clock signal of the IC and the input clock signal to the IC.

16. The EC platform of claim 15, wherein the master clock signal is from a dedicated master clock IC coupled to the IC.

17. The EC platform of claim 15, wherein the controller is further arranged to:
determine an adjustment phase or latency for the IC to generate an operational internal clock signal synchronized with the master clock signal; and
transmit an indication of the adjustment phase or latency to the IC to generate the operational internal clock signal synchronized with the master clock signal.

18. The EC platform of claim 17, wherein the IC is included in a set of ICs that are all coupled to the controller to form the topology, and the controller is further arranged to:
generate one or more commands to be sent to one or more ICs of the set of ICs, for each IC of the one or more ICs to measure a phase difference or latency difference between an initial internal clock signal of the each IC and an input clock signal to the each IC, wherein the initial internal clock signal of the each IC is generated by the each IC based on the source clock signal, and the input clock signal to the each IC is synchronized with an operational internal clock signal of a parent IC of the each IC in the topology or with the master clock signal;
receive a difference signal from the each IC to indicate the phase difference or the latency difference between the initial internal clock signal of the each IC and the input clock signal to the each IC;
determine an adjustment phase or latency for the each IC to generate an operational internal clock signal of the each IC that is synchronized with the master clock signal; and
transmit an indication of the adjustment phase or latency to the each IC to generate the operational internal clock signal of the each IC that is synchronized with the master clock signal.

19. The EC platform of claim 18, wherein the controller is further arranged to:
select an IC of the set of ICs as a master IC, wherein the master clock signal is an initial internal clock signal of the master IC generated by a clock divider of the master IC based on the source clock signal.

20. The EC platform of claim 18, wherein the topology formed by the set of ICs is a linear array topology, a star topology, or a tree topology.

21. The EC platform of claim 18, wherein the input clock signal received from the parent IC is the operational internal clock signal of the parent IC that is synchronized with the master clock signal.

22. The EC platform of claim 18, wherein the set of ICs further includes a clock distribution circuit, a memory circuit, or a direct digital frequency synthesizer (DDS).

23. A multiple-input multiple-output (MIMO) radar system, comprising:
an integrated circuit (IC), comprising:
a clock divider to receive a source clock signal and to generate an initial internal clock signal of the IC;
a time-to-digital converter (TDC) coupled to the clock divider to receive the initial internal clock signal and an input clock signal, wherein the input clock signal is synchronized with an operational internal clock signal of another IC or with a master clock signal, and wherein the TDC is to measure a phase difference or latency difference between the initial internal clock signal and the input clock signal, and to generate a difference signal to indicate the phase difference or the latency difference; and
a synchronization clock generator to generate an operational internal clock signal based on the initial internal clock signal and the difference signal, wherein the operational internal clock signal is synchronized with the master clock signal; and
a controller coupled to the IC, wherein the controller is to generate one or more commands to be sent to the IC for the IC to measure the phase difference or latency difference.

24. The MIMO system of claim 23, wherein the controller is to generate the one or more commands to be sent to the IC when the MIMO system is powered up.

25. The MIMO system of claim 23, wherein the MIMO system is disposed in a computer assisted or autonomous driving (CA/AD) vehicle.

* * * * *